(12) United States Patent
Briggs et al.

(10) Patent No.: US 10,290,541 B2
(45) Date of Patent: May 14, 2019

(54) BARRIER LAYERS IN TRENCHES AND VIAS

(71) Applicant: International Business Machines Corporation, Armonk, NY (US)

(72) Inventors: Benjamin D. Briggs, Waterford, NY (US); Lawrence A. Clevenger, Rhinebeck, NY (US); Cornelius Brown Peethala, Albany, NY (US); Michael Rizzolo, Albany, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/890,568

(22) Filed: Feb. 7, 2018

(65) Prior Publication Data

US 2018/0174899 A1 Jun. 21, 2018

Related U.S. Application Data

(62) Division of application No. 15/198,516, filed on Jun. 30, 2016, now Pat. No. 9,984,923.

(51) Int. Cl.
*H01L 21/768* (2006.01)
*H01L 23/532* (2006.01)
*H01L 23/522* (2006.01)

(52) U.S. Cl.
CPC .. *H01L 21/76862* (2013.01); *H01L 21/76802* (2013.01); *H01L 21/76843* (2013.01);
(Continued)

(58) Field of Classification Search
CPC ......... H01L 21/76841; H01L 21/76843; H01L 21/76864; H01L 21/76865;
(Continued)

(56) References Cited

U.S. PATENT DOCUMENTS 4,727,293 A 2/1988 Asmussen et al.
5,292,558 A 3/1994 Heller et al.
(Continued)

FOREIGN PATENT DOCUMENTS

TW 201612970 A 4/2016

OTHER PUBLICATIONS

C.T. Carver et al., "Atomic Layer Etching: An Industry Perspective," ECS Journal of Solid State Science and Technology, Feb. 2015, pp. N5005-N5009, vol. 4, No. 6.
(Continued)

*Primary Examiner* — Thanh Y. Tran
(74) *Attorney, Agent, or Firm* — Vazken Alexanian; Ryan, Mason & Lewis, LLP

(57) ABSTRACT

A semiconductor structure includes a dielectric layer having a trench formed therein and a barrier layer formed on a bottom and sidewalls of the trench, and on a top surface of the dielectric layer. The trench comprises a flared top gap opening and additional area at the bottom such that the top and bottom of the trench are wider than sidewalls of the trench. A thickness of the barrier layer on the bottom of the trench and on the top surface of the dielectric layer is controlled using one or more cycles comprising forming an oxidized layer using a neutral beam oxidation and removing the oxidized layer using an etching process, such that the thickness of the barrier layer on the bottom of the trench and on the top surface of the dielectric layer is substantially the same as the thickness of the barrier layer on sidewalls of the trench.

20 Claims, 5 Drawing Sheets

(52) U.S. Cl.
CPC .. *H01L 21/76865* (2013.01); *H01L 21/76877* (2013.01); *H01L 23/5226* (2013.01); *H01L 23/53238* (2013.01)

(58) Field of Classification Search
CPC ......... H01L 21/76867; H01L 21/76862; H01L 21/76802; H01L 21/76877; H01L 23/53238; H01L 23/5226
See application file for complete search history.

(56) References Cited

U.S. PATENT DOCUMENTS

| | | | |
|---|---|---|---|
| 6,713,341 B2* | 3/2004 | Chen | H01L 29/66181 257/E21.396 |
| 6,921,722 B2 | 7/2005 | Ogure et al. | |
| 7,273,638 B2 | 9/2007 | Belyansky et al. | |
| 7,422,983 B2 | 9/2008 | Cotte et al. | |
| 8,426,316 B2 | 4/2013 | Cotte et al. | |
| 8,608,973 B1 | 12/2013 | Guha | |
| 8,865,597 B2 | 10/2014 | Cotte et al. | |
| 2005/0064708 A1 | 3/2005 | May et al. | |
| 2005/0082089 A1* | 4/2005 | Grunow | H01L 21/76805 174/266 |
| 2005/0164464 A1* | 7/2005 | Hecht | C23C 16/045 438/386 |
| 2005/0260851 A1 | 11/2005 | Huang et al. | |
| 2006/0270239 A1 | 11/2006 | Triyoso et al. | |
| 2008/0026555 A1* | 1/2008 | Dubin | H01L 21/0273 438/597 |
| 2011/0256716 A1 | 10/2011 | Chiang et al. | |
| 2013/0224959 A1 | 8/2013 | Cotte et al. | |

OTHER PUBLICATIONS

G.S. Oehrlein et al., "Atomic Layer Etching at the Tipping Point: An Overview," ECS Journal of Solid State Science and Technology, Mar. 2015, pp. N5041-5053, vol. 4, No. 6.

K.J. Kanarik et al., "Overview of Atomic Layer Etching in the Semiconductor Industry," Journal of Vacuum Science & Technology A, Mar./Apr. 2015, pp. 020802-1-020802-14, vol. 33, No. 2.

Demetre J. Economou, "Fast (Tens to Hundreds of eV) Neutral Beams for Materials Processing," Journal of Applied Physics D: Applied Physics, Jan. 2008, pp. 1-11.

U.S. Appl. No. 15/131,157 filed in the name of Benjamin D. Briggs et al. on Apr. 18, 2016 and entitled "Selective and Non-Selective Barrier Layer Wet Removal."

List of IBM Patents or Patent Applications Treated as Related.

* cited by examiner

500

800

BARRIER LAYERS IN TRENCHES AND VIAS

BACKGROUND

The present application relates to semiconductors, and more specifically, to techniques for forming semiconductor structures. Various semiconductors and other electronic structures use trenches and/or vias to form connections between components thereof. The formation of such interconnects however, is increasingly difficult as semiconductor and other electronic structures are made smaller.

SUMMARY

Embodiments of the invention provide techniques for forming barrier layers in trenches and vias.

For example, in one embodiment a semiconductor structure comprises a dielectric layer having at least one trench formed therein and a barrier layer formed on a bottom of said at least one trench, sidewalls of said at least one trench and a top surface of the dielectric layer. Said at least one trench comprises a flared top gap opening and additional area at the bottom such that a top of said at least one trench and the bottom of said at least one trench are wider than sidewalls of said at least one trench. A thickness of the barrier layer on the bottom of said at least one trench and a thickness of the barrier layer on the top surface of the dielectric layer is controlled using one or more cycles comprising forming an oxidized layer using a neutral beam oxidation and removing the oxidized layer using an etching process, such that the thickness of the barrier layer on the bottom of said at least one trench and the thickness of the barrier layer on the top surface of the dielectric layer is substantially the same as the thickness of the barrier layer on the sidewalls of said at least one trench.

DETAILED DESCRIPTION

Illustrative embodiments of the invention may be described herein in the context of illustrative methods for forming barrier layers in trenches and/or vias, along with illustrative apparatus, systems and devices having barrier layers formed using such methods. However, it is to be understood that embodiments of the invention are not limited to the illustrative methods, apparatus, systems and devices but instead are more broadly applicable to other suitable methods, apparatus, systems and devices.

As semiconductor and other electronic structures continue to shrink in size, it is becoming more difficult to fill trenches and vias formed in such structures. Liners or barriers formed on the sidewalls of trenches and vias may be used to facilitate filling of trenches and/or vias to be used for interconnects in a resulting structure. As an example, liner or barrier scaling below 3 nanometers (nm) for copper (Cu) interconnects is desired for beyond 7 nm technology.

Figure 1:
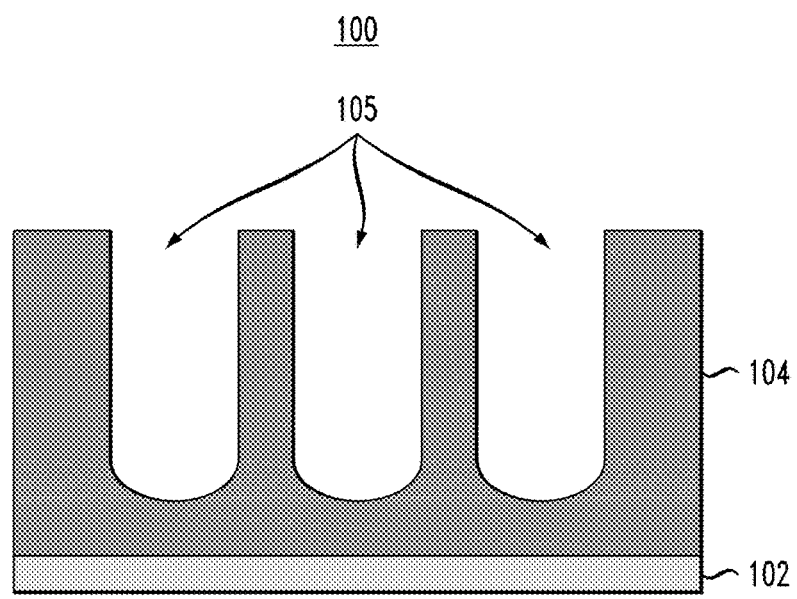
FIG. 1 depicts a side cross-sectional view of trenches formed in a structure, according to an embodiment of the invention.
Figure 2:
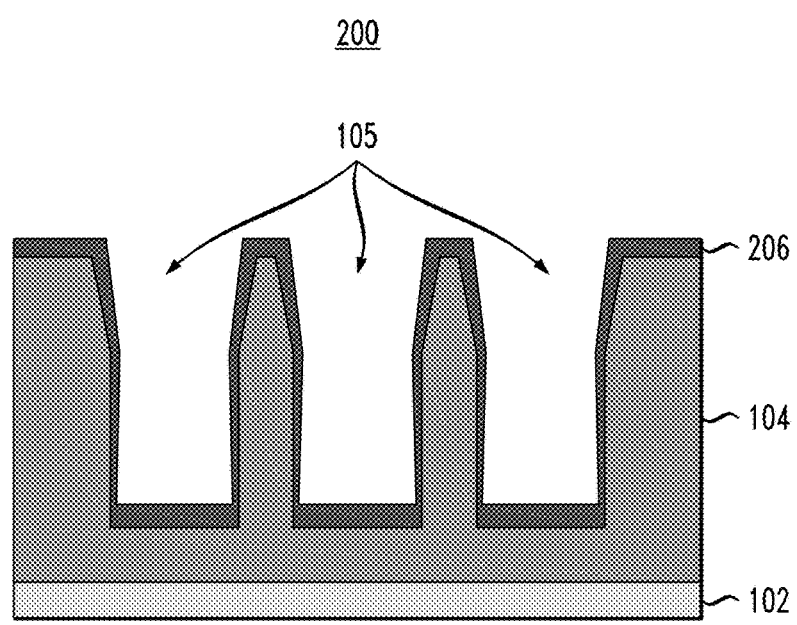
FIG. 2 depicts a side cross-sectional view of the FIG. 1 structure following formation of a barrier layer in the trenches using physical vapor deposition, according to an embodiment of the invention.
Figure 3:
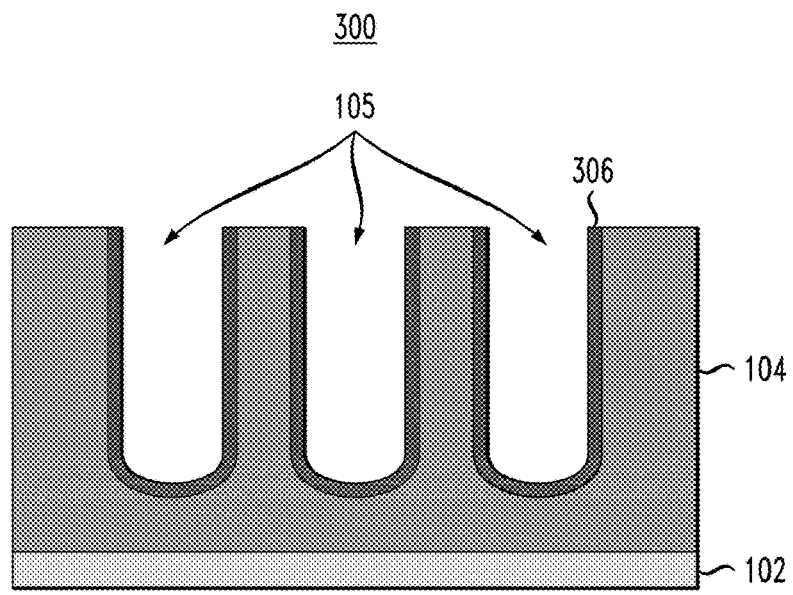
FIG. 3 depicts a side cross-sectional view of the FIG. 1 structure following formation of a barrier layer in the trenches using atomic layer deposition, according to an embodiment of the invention.

FIG. 1 depicts a side cross-sectional view 100 of a substrate 102 and a dielectric layer 104, with trenches 105 formed in the dielectric layer 104. The substrate 102 may be formed of silicon carbide (SiC), silicon carbon nitride (SiCN), SiCNH, silicon nitride oxide (SiNO) and various other dielectric capping materials. The substrate 102 may range in thickness from 1 to 500 angstroms (Å) in some embodiments. The dielectric layer 104 may be formed of various dielectrics, including ultra low-K (ULK) dielectrics. The dielectric layer 104 may range in thickness from 5 to 2000 Å in some embodiments. To facilitate formation of interconnects, it is desirable to form a liner or barrier layer in the trenches 105. The trenches 105 may be formed using single or dual damascene techniques. FIGS. 2 and 3 show examples of barrier layers formed using physical vapor deposition (PVD) and an atomic layer deposition (ALD) or post-dielectric reactive-ion etching (RIE).

While FIGS. 1, 2, 3, 4 and 5 show a structure having three trenches of equal size, this is not a requirement. A structure may have any number of trenches, with different trenches having different depths, thicknesses, heights, etc. In addition, spacing between trenches need not be uniform. One or more vias that extend through the entirety of the dielectric layer may also be formed in some embodiments, possibly with one or more trenches or blind vias in the same structure.

FIG. 2 shows a side cross-sectional view 200 of the FIG. 1 structure following formation of barrier layer 206 by PVD. The barrier layer 206, also referred to herein as a liner, may be formed of tantalum (Ta), tantalum nitride (TaN), titanium (Ti), titanium nitride (TiN), a bilayer of TaN/Ta, or other suitable material. As shown in FIG. 2, the thickness of barrier layer 206 may vary in different portions of the trenches 105. The thickness of the barrier layer 206 on the top of the dielectric layer 104 and at the bottom of the trenches 105 may be approximately 30 Å, and more generally range from 5 to 60 Å in some embodiments. In other portions, such as on the sidewalls of the trenches 105, the barrier layer 206 is thinner due to the poor step coverage of the barrier layer 206 formed using PVD.

The use of PVD to form barrier layer 206 provides certain advantages. For example, PVD modifies the dielectric layer 104, through densification and/or etching, to provide a flared top gap opening of the trenches 105 as well as additional area at the bottom of trenches 105 via corner and/or bottom sharpening. The flared top gap opening and additional area are caused by the PVD interacting with the dielectric layer 104, which may be a ULK dielectric such as porous SiCOH (p-SiCOH), porous SiCNO (p-SiCNO), porous SiNCH (p-SiNCH), etc. formed via chemical vapor deposition (CVD).

The barrier layer 206 formed via PVD, however, also has certain drawbacks. As described above, the thickness of the barrier layer 206 formed using PVD is not uniform. For example, the portions of the barrier layer 206 on the top of dielectric layer 104 and on the bottom of the trenches 105 may be thicker than desired, while the portions of the barrier layer 206 on sidewalls of the trenches 105 may be a suitable thickness. It is to be appreciated, however, that in some instances it may be desired to thin the barrier layer 206 formed on the sidewalls of the trenches 105. The techniques described herein for thinning the barrier layer 206 formed on the bottom of the trenches 105 may also be used to thin the barrier layer 206 on sidewalls of the trenches 105 in such cases.

In some embodiments, it is desired for the barrier layer 206 to be as thin as possible, so as to maximize area for Cu interconnects to achieve resistance targets. As an example, some structures may have approximately 50% of the total interconnect area being non-Cu material. An etch-back process, such as an argon (Ar) sputter, is a potential solution for scaling thickness of the barrier layer, but re-deposition of the sidewalls of trenches 105 using such techniques may prevent complete scaling of the barrier layer 206.

FIG. 3 shows a side-cross sectional view 300 of the FIG. 1 structure following formation of barrier layer 306 using ALD or a post dielectric RIE. The barrier layer 306 may be formed of materials similar to that of barrier layer 206, but of different composition. The barrier layer 306, formed using ALD, may have a ratio of Ta to N of approximately 1:1. The barrier layer 206, formed using PVD, may have approximately 30% N. Increasing N content increases resistivity, and thus PVD may be preferred to ALD. While ALD can provide for uniform thickness of the barrier layer 306, the barrier layer 306 formed using ALD has higher resistivity relative to the barrier layer 206 formed using PVD. In addition, ALD does not cause the flared openings or flattening of the bottom of trenches 105 shown in FIG. 2 using PVD. Thus, ALD does not provide the fill advantages that the use of PVD does.

In some embodiments, a cycling process is used to etch barrier material 206 in the FIG. 2 structure, so as to achieve the benefits of PVD with respect to the flared openings and flattened bottoms of trenches 105 while achieving scalability of the thickness of the barrier layer 206 comparable to or greater than that of using ALD.

Figure 4:
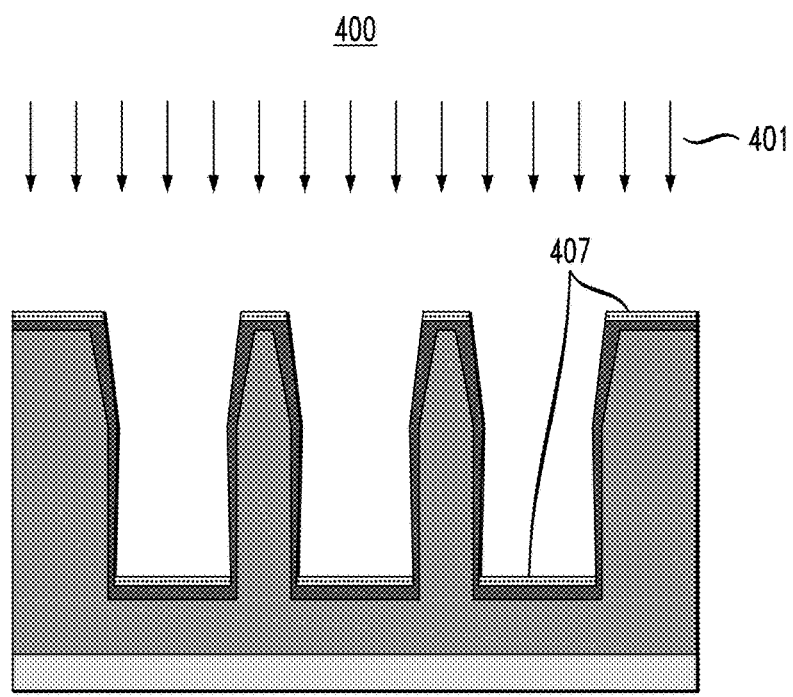
FIG. 4 depicts a side cross-sectional view of the FIG. 2 structure following oxidation of portions of the barrier layer, according to an embodiment of the invention.

FIG. 4 depicts a side cross-sectional view 400 of the FIG. 2 structure following oxidation of portions of the barrier layer 206 using a neutral beam oxidation 401 to form oxidized layers 407. As shown, the oxidized layer 407 is formed on the top of the dielectric 104 as well as at the bottoms of the trenches 105. The neutral beam oxidation 401 uses a neutral atom beam treatment of low energy oxygen (O) particles, e.g., on the range of 10-100+ electronvolts (eV). The neutral atom beam treatment is electrically neutral, and provides surface penetration of 1-3 nm. As an example, accelerated neutral atom beam (ANAB) treatments of 10-100 eV can form an amorphized layer such as oxidized layer 407 of less than 3 nm thickness. In a specific example wherein the barrier layer 206 is formed of Ta or TaN, the neutral beam oxidation 401 oxidizes the top 5-10 Å of the barrier layer.

The neutral beam oxidation 401 may be made highly directional, such that only the top of the dielectric 104 and the bottom of trenches 105 receive sufficient oxidation to form the surface oxidation layer 407. While it is possible for portions of the sloped sidewall to be hit by the neutral beam oxidation 401, the highly directional nature of the neutral beam oxidation 401 means that any oxidation on the sidewalls of the trenches 105 will be minimal in comparison to the oxidation at the top of the dielectric 104 and the bottom of the trenches 105.

Modified etch-K chemistries, with no oxidizer and low $O_2$, may be used to remove the surface oxidation layer 407. U.S. patent application Ser. No. 15/131,157, filed Apr. 18, 2016 and titled "Selective and Non-Selective Barrier Layer Wet Removal," which is commonly assigned herewith and incorporated by reference herein in its entirety, provides details of etchant chemistries referred to herein as etch-K chemistries. Some embodiments may utilize modified versions of the etch-K chemistries described in U.S. patent application Ser. No. 15/131,157. For example, modified etch-K chemistries used in some embodiments do not utilize hydrogen peroxide ($H_2O_2$), such that the etchant is not capable of continuous etching of the barrier layer (e.g., Ta or TaN), and instead only etches the oxidized layer 407.

For example, such a modified etch-K chemistry includes a selective etch that allows barrier layer 206 (e.g., TaN) to be removed selective to dielectric layer 104 (e.g., a ULK material) and comprises 10 grams/liter (g/L) Benzotriazole (BTA)+0.5 g/L cyclohexanediamininetetraaceticacid (CDTA)+potassium hydroxide (KOH) in deionized (DI) water at a pH in the range of about 4 to about 12. Etching can be performed at temperatures ranging from about 25° C. to about 70° C. Other possible variations for the modified etch-K chemistry include, but are not necessarily limited to: (a) replacing KOH by another alkaline metal hydroxide, such as, for example, one of LiOH, NaOH, RbOH, CsOH, and combinations thereof, at concentration ranges of about 0.001M to about 0.1M (molar); (b) replacing CDTA by another peroxide stabilizer, such as, for example, one of diethylenetriaminepenta(methylene-phosphonic acid) (DTPMPA) and ethylenediaminetetraacetic acid (EDTA) at concentration ranges of about 0.1 g/L to about 1 g/L; and (c) replacing BTA by another corrosion inhibitor, such as, for example, one of 1,2,3 triazole, 1,3,4 triazole, 1,2,4 triazole, imidazole, methyl-thiol-triazole, thiol-triazole, triazole acid, 5-methyl-1H-benzotriazole, at concentration ranges of about 0.1 g/L to about 10 g/L. The above described modified etch-K chemistry, in addition to selectively etching barrier layer 206 (e.g., TaN) with respect to dielectric layer 104 (e.g., an ULK material), may also be used to etch selective to copper (Cu), cobalt (Co) and ruthenium (Ru), such that the barrier layer 206 comprising TaN can be selectively removed with respect to a structure comprising Cu, Co and Ru.

Barrier layer 206 may also be selectively recessed along with Cu in a single etching process using, for example, a modified etch-K chemistry comprising 10 g/L BTA+0.1 M (moles) ammonia ($NH_3$)+0.5 g/L CDTA+KOH in DI water at a pH range of about 4 to about 12. Etching can be performed at a temperature range of about 25° C. to about 70° C. Other possible variations for the modified etch-K chemistry include, but are not necessarily limited to (a) replacing KOH by another alkaline metal hydroxide, such as, for example, one of LiOH, NaOH, RbOH, CsOH, and combinations thereof, at concentration ranges of about 0.001M to about 0.1M (molar); (b) replacing CDTA by another peroxide stabilizer, such as, for example, one of DTPMPA and EDTA at concentration ranges of about 0.1 g/L to about 1 g/L; and (c) replacing BTA by another corrosion inhibitor, such as, for example, one of 1,2,3 triazole, 1,3,4 triazole, 1,2,4 triazole, imidazole, methyl-thiol-triazole, thiol-triazole, triazole acid, 5-methyl-1H-benzotriazole, at concentration ranges of about 0.1 g/L to about 10 g/L. $NH_3$ in water can be from one of the sources ammonium hydroxide (NH$_4$OH), ammonium phosphate, or ammonium dihydrogen phosphate. Other complexing agents such as, bidentate or tridentate copper complexants including amino carboxylic acids (amino acids), amino phosphonic acids, di and tri-carboxylic acids, di and tri-phosphonic acids, carboxyphosphonic acids, or combinations thereof, can be used in place of NH$_3$. The above-described modified etch-K chemistry selectively etches both TaN and Cu with respect to ULK materials, and also selectively etches TaN and Cu with respect to Co and Ru, so that a barrier layer 206 comprising TaN and another layer comprising Cu can both be selectively removed in the same etch step with respect to ULK materials and/or Co and Ru. The etch selectivity of TaN with respect to Cu can be altered by modifying amounts of ammonia, which can be added via NH$_4$OH.

Figure 5:
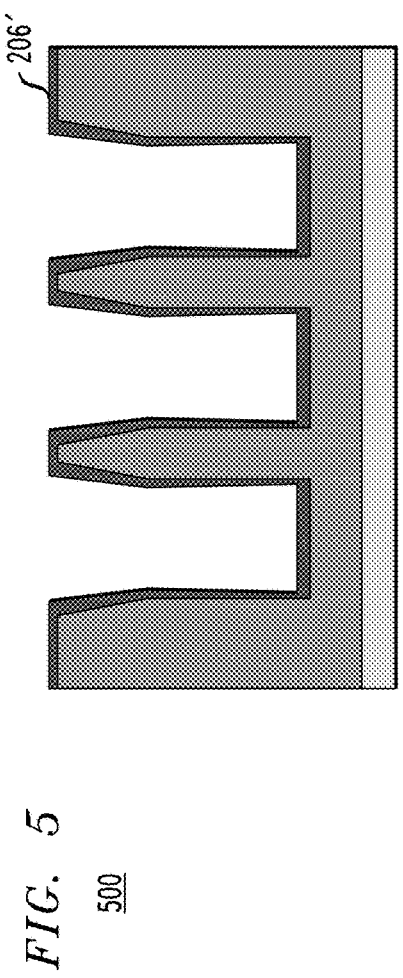
FIG. 5 depicts a side cross-sectional view of the FIG. 4 structure following removal of the oxidized portions of the barrier layer, according to an embodiment of the invention.

FIG. 5 shows a side cross-sectional view 500 of the FIG. 4 structure following removal of the oxidized layer 407, which may be achieved using one of the modified etch-K chemistries described above. Thus, as shown, the original barrier layer 206 is thinned where the oxidized layer 407 is formed and removed to produce barrier layer 206'. In some embodiments, the neutral beam oxidation 401 and etching using a modified etch-K chemistry may be repeated in cycles to perform an atomic layer etch (ALE) or digital etch of the barrier layer 206 to a desired thickness while maintaining the trench profile modifications provided by PVD described above with respect to FIG. 2.

Figure 6:
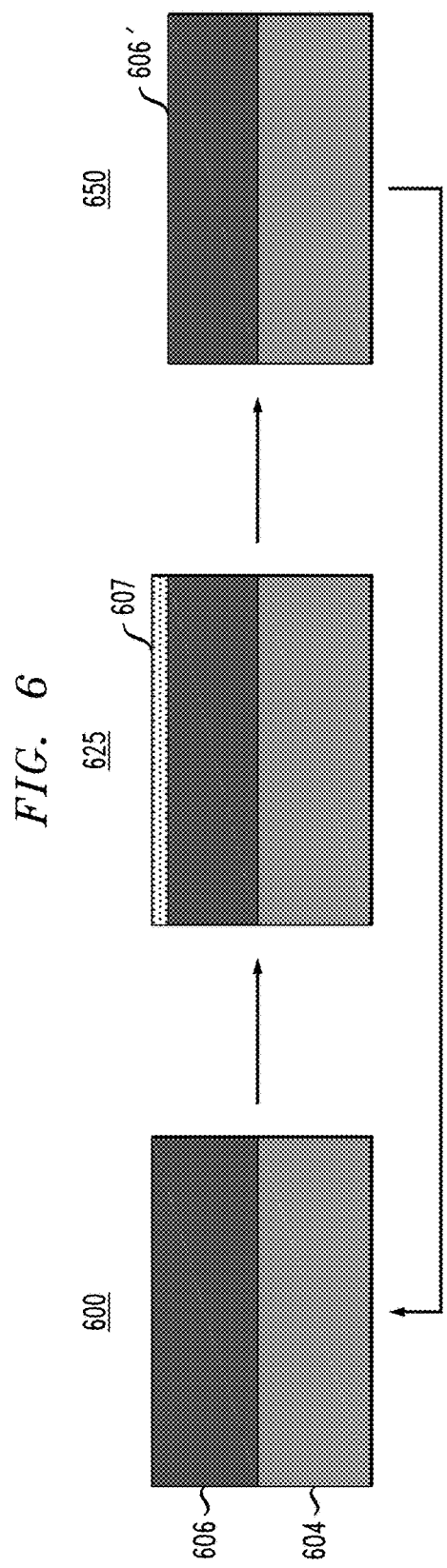
FIG. 6 depicts close up views of a cycling process to etch barrier material in a structure, according to an embodiment of the invention.

FIG. 6 depicts side cross-sectional views 600, 625 and 650 of a cycling process to etch barrier material. The views 600, 625 and 650 may be considered as close-up views of a bottom wall of one of the trenches 105 in FIGS. 2, 4 and 5, respectively. View 600 shows a dielectric layer 604 and barrier layer 606 formed over the dielectric layer 604. An O neutral beam, having an energy in the range of 1-100 eV, is applied perpendicular to the surface of barrier layer 606 to form the structure shown in view 625, which has oxidized layer 607. Next, the oxidized layer 607 is removed as shown in view 650. In the view 650, the original barrier layer is thinned to form barrier layer 606'. The process shown in views 600, 625 and 650 may be cycled or repeated to thin the barrier layer 606' further. As will be appreciated, the number of cycling steps may vary as needed to produce a desired thickness of the barrier layer. For example barrier layer 606 may have a thickness of 30 Å, while oxidized layer 607 may have a thickness of 2-10 Å such that the barrier layer 606' has thickness of 20-28 Å. The low landing energy of the O neutral beam, in some embodiments, does not permit thicker oxidized layers to be formed. Thus, to remove a desired amount of the barrier layer 606 it may be necessary to use multiple cycles.

Figure 7:
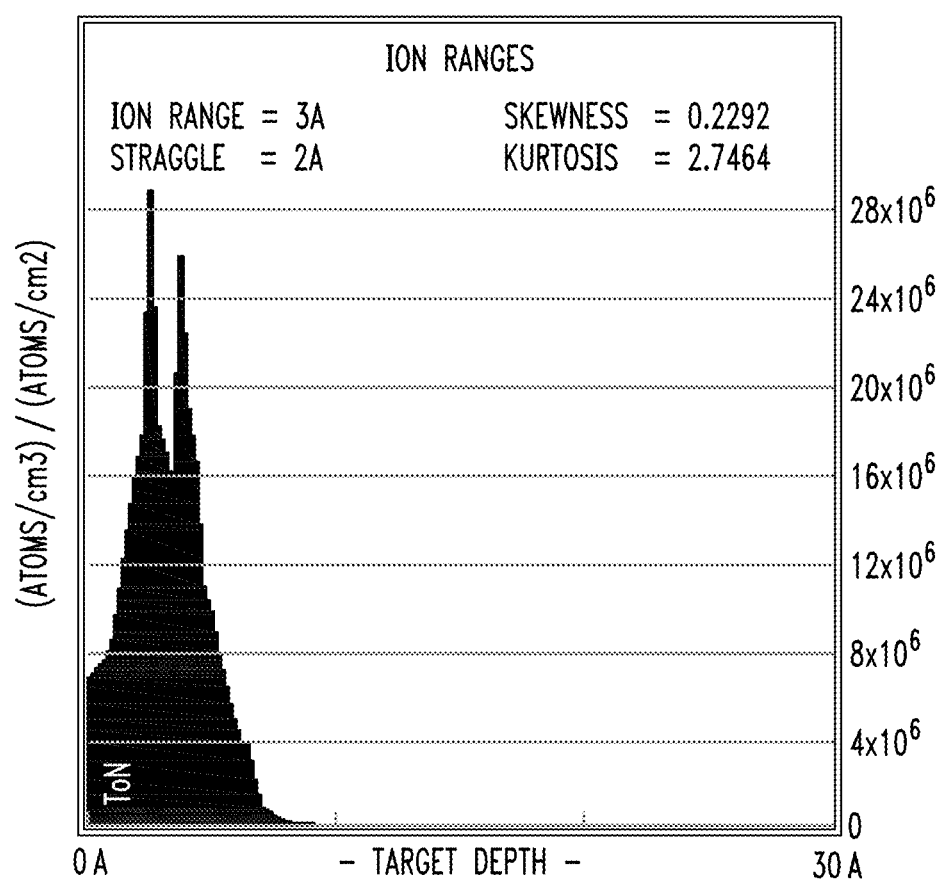
FIG. 7 depicts a plot of the depth of oxidation using a neutral beam oxidation process, according to an embodiment of the invention.
Figure 8:
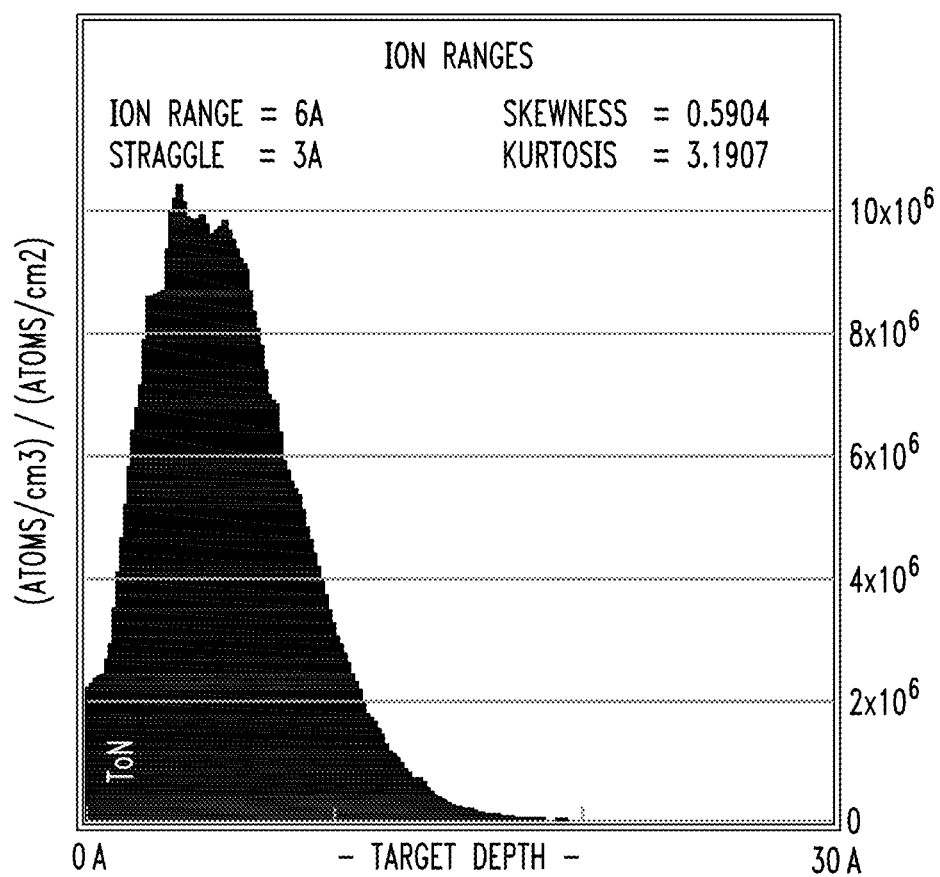
FIG. 8 depicts a plot of the depth of oxidation using another neutral beam oxidation process, according to an embodiment of the invention.

FIGS. 7 and 8 show plots 700 and 800, respectively, of the depth of oxidation using different neutral beam oxidation processes. For example, plot 700 shows a 10 eV O into TaN neutral beam oxidation, while plot 800 shows a 50 eV O into TaN neutral beam oxidation. Plots 700 and 800 show the difference in ion range, straggle, skewness and kurtosis using the 10 ev and 50 eV O into TaN neutral beam oxidations. As illustrated, the O beam at these energies cannot penetrate and oxidize the entirety of the barrier layer, allowing for a controlled cyclic removal process to provide precise control of the thickness of the barrier layer.

In some embodiments, a method of forming a semiconductor structure comprises forming at least one trench in a dielectric layer, forming a barrier layer on a bottom of said at least one trench, sidewalls of said at least one trench and a top surface of the dielectric layer, the barrier layer having a non-uniform thickness, and selectively thinning at least a first portion of the barrier layer using one or more cycles comprising forming an oxidized layer in the first portion of the barrier layer using a neutral beam oxidation and removing the oxidized layer using an etching process. Forming the barrier layer may utilize PVD, where forming the barrier layer modifies a shape of said at least one trench by forming a flared top gap opening of said at least one trench and additional area at the bottom of said at least one trench such that a top of said at least one trench and the bottom of said at least one trench are wider than sidewalls of said at least one trench. The additional area may be formed by flattening the bottom of said at least one trench.

Each cycle of thinning the first portion of the barrier layer may comprise atomic layer etching that maintains the modified shape of said at least one trench. Also, each cycle of thinning the first portion of the barrier layer may remove 2-10 Å of the thickness of the barrier layer.

The first portion of the barrier layer may comprise at least one of the bottom of said at least one trench and the top surface of the dielectric layer. A thickness of the first portion of the barrier layer, prior to selectively thinning the first portion of the barrier layer, may be greater than a thickness of the barrier layer on sidewalls of said at least one trench.

The dielectric layer may comprise a ULK dielectric material, and the barrier layer may comprise one of Ta and TaN. The neutral beam oxidation may utilize an oxygen neutral beam that transforms a top of the first portion of the barrier layer to tantalum oxide or a tantalum oxy nitride. Each cycle of thinning the first portion of the barrier layer removes a thickness of 2 to 10 angstrom of the first portion of the barrier layer. The etching process may utilize an etchant that etches tantalum oxide and tantalum oxy nitride selective to the ULK dielectric material. The oxygen neutral beam has an energy in the range of 1 to 100 electronvolts. Selectively thinning the first portion of the barrier layer comprises utilizing two or more cycles of the oxygen neutral beam having an energy of approximately 50 electronvolts, or two or more cycles of the oxygen neutral beam having an energy of approximately 10 electronvolts. In some embodiments, each of the cycles utilizes a neutral beam oxidation having a same energy level, while in other embodiments two or more of the cycles utilize neutral beam oxidations having different energy levels.

In some embodiments, a semiconductor structure comprises a dielectric layer having at least one trench formed therein and a barrier layer formed on a bottom of said at least one trench, sidewalls of said at least one trench and a top surface of the dielectric layer. Said at least one trench comprises a flared top gap opening and additional area at the bottom such that a top of said at least one trench and the bottom of said at least one trench are wider than sidewalls of said at least one trench. A thickness of the barrier layer on the bottom of said at least one trench and a thickness of the barrier layer on the top surface of the dielectric layer is controlled using one or more cycles comprising forming an oxidized layer using a neutral beam oxidation and removing the oxidized layer using an etching process, such that the thickness of the barrier layer on the bottom of said at least one trench and the thickness of the barrier layer on the top surface of the dielectric layer is substantially the same as the thickness of the barrier layer on the sidewalls of said at least one trench. The barrier layer may comprises one of Ta and TaN.

It is to be appreciated that the barrier layer may not have a uniform thickness on the sidewalls of said at least one trench. Thus, the phrase substantially the same in this context refers to a maximum thickness of the sidewalls of said at least one trench. Also, the phrase substantially the same is intended to mean that the thickness need not be exactly the same as one another, just within a defined threshold of one another. This threshold tolerance may vary depending on the needs of a particular application or device. In some embodiments, this threshold tolerance may be an absolute number, such as the amount of barrier layer that may be removed in one cycle, e.g., 2-10 Å. For example, if one cycle can be calibrated so as to remove 3 Å thickness of the barrier layer, the thickness at the bottom of the trenches and on the sidewalls of the trenches may be considered substantially the same if they are within 3 Å of one another. In other embodiments, the threshold tolerance may be a percentage difference, such as 5%, 10%, etc. The particular percentage may also be based on the amount of barrier layer that may be removed in one cycle.

In some embodiments, a method of forming a semiconductor structure comprises forming at least one trench in a dielectric layer, depositing a barrier layer in said at least one trench and on a top surface of the dielectric layer using physical vapor deposition, the physical vapor deposition modifying a profile of said at least one trench such that said at least one trench comprises a flared top gap opening and additional area at the bottom such that a top of said at least one trench and the bottom of said at least one trench are wider than sidewalls of said at least one trench, and controlling a thickness of the barrier layer by selectively thinning one or more portions of the barrier layer using one or more cycles comprising forming an oxidized layer using a neutral beam oxidation and removing the oxidized layer using an etching process.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require, for example, complementary metal-oxide semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
 a dielectric layer having at least one trench formed therein; and
 a barrier layer formed on a bottom of said at least one trench, sidewalls of said at least one trench and a top surface of the dielectric layer;
 wherein said at least one trench comprises a flared top gap opening and an additional opening at the bottom such that a top width of said at least one trench and a bottom width of said at least one trench are wider than a width between at least a portion of sidewalls of said at least one trench;
 wherein a thickness of the barrier layer on the bottom of said at least one trench and a thickness of the barrier layer on the top surface of the dielectric layer is controlled such that the thickness of the barrier layer on the bottom of said at least one trench and the thickness of the barrier layer on the top surface of the dielectric layer are each substantially the same as the thickness of the barrier layer on the sidewalls of said at least one trench; and
 wherein the barrier layer comprises a nitride having a higher concentration of non-nitrogen material than nitrogen.

2. The semiconductor structure of claim 1, wherein the barrier layer comprises tantalum nitride.

3. The semiconductor structure of claim 1, wherein the barrier layer comprises titanium nitride.

4. The semiconductor structure of claim 1, wherein the barrier layer comprises a bilayer of tantalum nitride and tantalum.

5. The semiconductor structure of claim 1, wherein the dielectric layer comprises an ultra low-k (ULK) dielectric material.

6. The semiconductor structure of claim 5, wherein the ULK dielectric material comprises one of porous SiCOH, porous SiCNO and porous SiNCH.

7. The semiconductor structure of claim 1 wherein the concentration of nitrogen in the nitride is approximately 30%.

8. A semiconductor structure, comprising:
 a dielectric layer having at least one trench formed therein; and
 a barrier layer disposed on a bottom of said at least one trench, sidewalls of said at least one trench and a top surface of the dielectric layer;
 wherein said at least one trench comprises a flared top gap opening and an additional opening at the bottom such that a top width of said at least one trench and a bottom width of said at least one trench are wider than a width between at least a portion of the sidewalls of said at least one trench;

wherein a thickness of the barrier layer on the bottom of said at least one trench and a thickness of the barrier layer on the top surface of the dielectric layer are each substantially the same as a thickness of the barrier layer on the sidewalls of said at least one trench;

wherein the barrier layer comprises nitrogen and non-nitrogen material, the non-nitrogen material in the barrier layer having a higher concentration than the nitrogen in the barrier layer.

9. The semiconductor structure of claim 8, wherein the barrier layer comprises tantalum nitride.

10. The semiconductor structure of claim 8, wherein the barrier layer comprises titanium nitride.

11. The semiconductor structure of claim 8, wherein the barrier layer comprises a bilayer of tantalum nitride and tantalum.

12. The semiconductor structure of claim 8, wherein the dielectric layer comprises an ultra low-k (ULK) dielectric material.

13. The semiconductor structure of claim 12, wherein the ULK dielectric material comprises one of porous SiCOH, porous SiCNO and porous SiNCH.

14. The semiconductor structure of claim 8 wherein the concentration of nitrogen in the barrier layer is approximately 30%.

15. An integrated circuit, comprising:
a semiconductor structure comprising:
  a dielectric layer having at least one trench formed therein; and
  a barrier layer disposed on a bottom of said at least one trench, sidewalls of said at least one trench and a top surface of the dielectric layer;

wherein said at least one trench comprises a flared top gap opening and an additional opening at the bottom such that a top width of said at least one trench and a bottom width of said at least one trench are wider than a width between at least a portion of the sidewalls of said at least one trench;

wherein a thickness of the barrier layer on the bottom of said at least one trench and a thickness of the barrier layer on the top surface of the dielectric layer are each substantially the same as a thickness of the barrier layer on the sidewalls of said at least one trench;

wherein the barrier layer comprises nitrogen and non-nitrogen material, the non-nitrogen material in the barrier layer having a higher concentration than the nitrogen in the barrier layer.

16. The integrated circuit of claim 15, wherein the barrier layer comprises tantalum nitride.

17. The integrated circuit of claim 15, wherein the barrier layer comprises titanium nitride.

18. The integrated circuit of claim 15, wherein the barrier layer comprises a bilayer of tantalum nitride and tantalum.

19. The integrated circuit of claim 15, wherein the dielectric layer comprises an ultra low-k (ULK) dielectric material.

20. The integrated circuit of claim 19, wherein the ULK dielectric material comprises one of porous SiCOH, porous SiCNO and porous SiNCH.

* * * * *